United States Patent [19]

Lear

[11] 4,370,567
[45] Jan. 25, 1983

[54] SEMICONDUCTOR SWITCH DEVICE SUITABLE FOR A.C. POWER CONTROL

[75] Inventor: Anthony Lear, Huntingdon, England

[73] Assignee: Texas Instruments Incorporated, Dallas, Tex.

[21] Appl. No.: 179,574

[22] Filed: Aug. 21, 1980

[30] Foreign Application Priority Data

Aug. 22, 1979 [GB] United Kingdom ............... 7929184

[51] Int. Cl.$^3$ .......................................... H03K 17/72
[52] U.S. Cl. ............................ 307/252 T; 307/252 B; 307/252 UA; 357/38; 357/39
[58] Field of Search .......... 307/252 B, 252 T, 252 A, 307/252 UA, 305; 357/38, 39

[56] References Cited

U.S. PATENT DOCUMENTS 3,970,843 7/1976 Dumas ................................. 357/39

Primary Examiner—John Zazworsky
Attorney, Agent, or Firm—N. Rhys Merrett; Melvin Sharp; Gary Honeycutt

[57] ABSTRACT

A semiconductor switch device suitable for a.c. power control includes three 4-layer switch components in parallel in a single body of semiconductor material. First and second components are of the same polarity and of opposite polarity to the third component. One end connection of the second component is taken out as a secondary gate connection separate from the corresponding connections of the first and third components. In a preferred mode of use, the secondary gate connection is maintained at a d.c. potential relative to the corresponding connections of the first and third components so as to enable the second component to be conducting during the zero crossings of the a.c. supply and able to maintain the internal voltages required for conduction of either or both of the other components. Circuits are given for integrated circuits embodying the device to permit zero voltage switching power controllers to be made with few external components, and for a proportional controller providing a variable mark-to-space ratio in dependence upon a variable resistor.

23 Claims, 14 Drawing Figures

SEMICONDUCTOR SWITCH DEVICE SUITABLE FOR A.C. POWER CONTROL

This invention relates to a semiconductor switch suitable for a.c. power control.

In order to control power drawn from an a.c. electricity source, such as a mains supply, it is usual for the controller to be arranged to switch the current on and off so that little power is consumed by the controller itself thereby avoiding wastage and the need to provide cooling for the controller. In order to avoid interference with other apparatus connected to the electricity source as a result of the switching transients it is necessary to time the switching so that it occurs when the alternating supply voltage is zero, and to achieve this circuits have been devised for providing zero voltage switching of a triac or two S.C.R.'s connected in parallel to conduct alternate phases of the supply current. Hitherto, the circuits required to provide zero voltage switching have involved a number of active and passive components, and in some cases specially designed integrated circuits have been used.

It is an object of the present invention to provide a semiconductor switch suitable for a.c. power control.

According to one aspect of the present invention there is provided a semiconductor switch device including a thyristor structure having first and second four-layer semiconductor switch components formed in the same body of semiconductor material, and a first gate connection, wherein there is provided a third four-layer semiconductor switch component in the same body so as to be electrically coupled to the first and second components, and an end terminal of the third component being electrically separate from corresponding terminals of the first and second components to provide a second gate connection for the device.

According to a second aspect of the present invention there is provided a semiconductor switch device comprising three four-layer semiconductor switch components extending in parallel from one major face to the other in the same body of semiconductor material, the body including a first layer of a first conductivity type extending to the one major face, a second layer of a second conductivity type, opposite to the first conductivity type, extending from the first layer to the other major face, first, second and third regions of the second conductivity type formed in the first major face, first and second regions of the first conductivity type respectively formed in the first and second regions of the second conductivity and extending to the first major face, and a third region of the first conductivity type formed in the other major face opposite the third region of the second conductivity type formed in the one major face, the first regions and adjacent parts of the first and second layers forming a first of the semiconductor switch components, the second regions and adjacent parts of the first and second layers forming a second of the semiconductor switch components, and the third regions and the parts of the first and second layers between them forming a third of the semiconductor switch components, the second regions being sufficiently close to the first and third regions for there to be sufficient d.c. coupling between the first and second components and between the second and third components for one of the components to be able to switch the other, a first main terminal being formed by an ohmic connection from the first region of the first conductivity type to the third region of the second conductivity type, a second main terminal being formed by an ohmic connection from the third region of the first conductivity type to parts of the other face of the body opposite the first and second regions, a first gate connection to the first region of the second conductivity type and a second gate connection to the second region of the first conductivity type.

A switch device according to the above paragraph may incorporate an additional region (or a plurality of such regions) of relatively low conductivity or impurity level and the second conductivity type between regions of the second conductivity type formed in the first major face and the material of the first conductivity type forming the first layer; the function of such additional region or regions is to increase the reverse breakdown voltage of the p-n junctions formed between the regions of second conductivity type and the first layer and therefore also increase the operating voltage of the device.

Another modification of the device which may be used with or without the above additional region is to form the first and second regions of the second conductivity type as a single combined region so as to enhance the coupling between the first semiconductor switch components.

A switch device according to the invention may be manufactured as a discrete device or incorporated in an integrated circuit with means for deriving from a supply a.c. main a suitable d.c. voltage for the secondary gate to maintain the conductivity of the device over the whole of the alternating voltage cycle once it has been triggered at its gate. The integrated circuit may also include a thyristor connected from the means providing a voltage for the secondary gate to the gate of the device to which an alternating voltage derived from the supply is applied when in use, so that conduction of the device is initiated by non-conduction of the thyristor which can only start at a zero crossing of the supply voltage. The regenerative action of the four-layer switch components in the device ensures that it will remain conducting until the next zero crossing of the supply voltage following the removal of the triggering voltage from the gate.

The integrated circuit may include an additional thyristor which is switchable off and on in response to the voltage on an input terminal of the circuit so as to provide, in conjunction with an external capacitor connected to the input terminal, a switching waveform for the first-mentioned thyristor having mark-to-space ratio which is dependent on an external parameter, such as the resistance of a thermistor of a photo-diode.

A switch device embodying the invention, while particularly suited for zero voltage switching under control of a very simple circuit, is also amenable to being switched at other points in the a.c. power supply voltage cycle.

In order that the invention may be fully understood and readily carried into effect embodiments of the invention and applications of the embodiments will now be described with reference to the accompanying drawings, of which:

Figure 1:
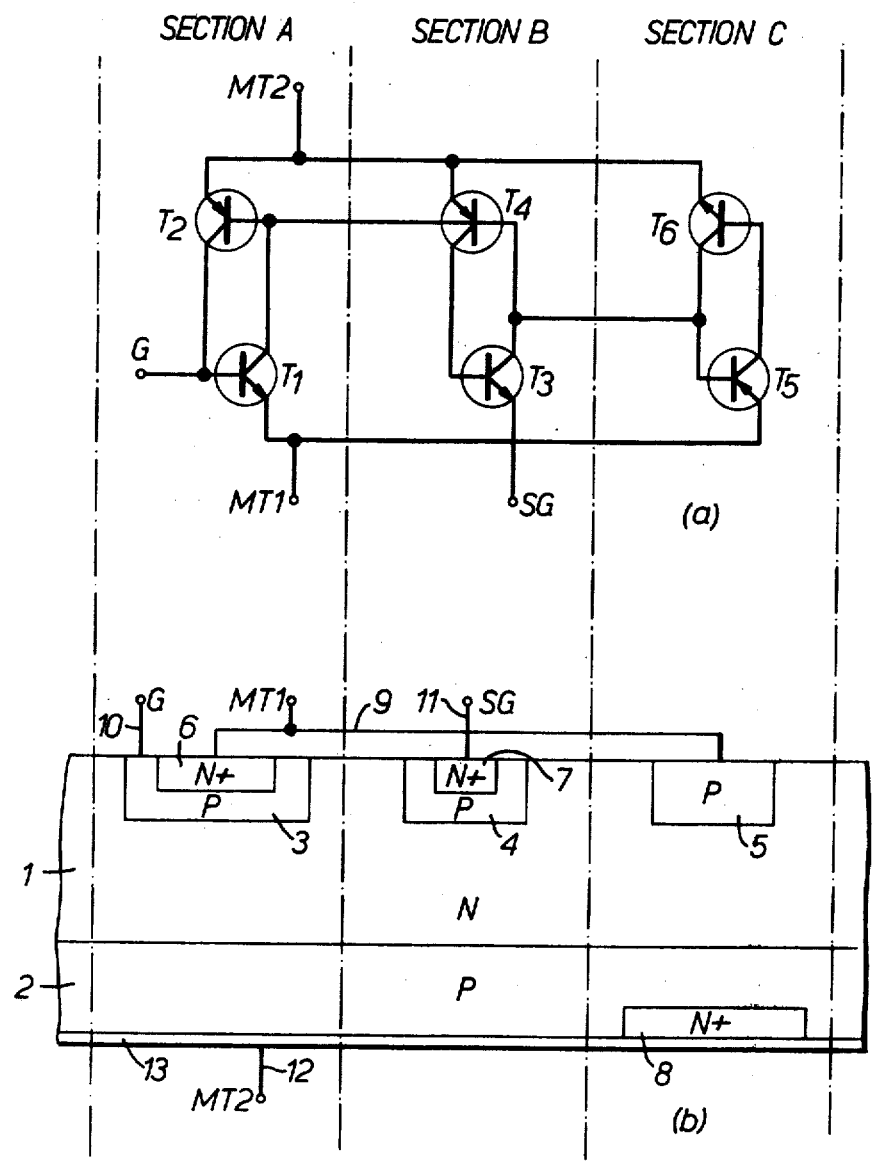
FIG. 1 shows one embodiment of the invention, the transistor equivalent circuit being shown at (a) and the semiconductor structure at (b)

Referring now to FIG. 1, the device shown has three components designated SECTION A, SECTION B, and SECTION C. Each component is a four-layer semiconductor switch of which a conventional transistor analogous circuit is shown at (a) and a representation of the semiconductor structure is shown at (b). Considering the semiconductor structures themselves first, these are all formed in the same semiconductor body comprising a first layer 1 of n-type conductivity extending to an upper major surface of the body and a second layer 2 of p-type conductivity extending to a lower major surface of the body. In the upper major surface are formed three regions 3, 4 and 5 of p-type conductivity in respective sections of the device. Two regions 6 and 7 of n+-type conductivity are formed in the regions 3 and 4 respectively. A third region 8 of n+-type conductivity is formed in the lower surface of the second layer 2 opposite the region 5 in the upper surface of the first layer 1. Metallization is applied to the upper surface for connection purposes and this is shown diagrammatically as a line 9 joining the regions 5 and 6 together and to a terminal MT1, a line 10 joining the region 3 to gate terminal G, and a line 11 joining the region 7 to a secondary gate terminal SG. A terminal MT2 is connected as indicated by a line 12 to a layer 13 of metallization which extends all over the lower surface.

The analogous transistor circuit for a four-layer semiconductor switch is a two-state trigger formed by the direct regenerative interconnection of two complementary transistors. The switch component in SECTION A is represented by transistors T1 and T2 with the collector of T1 connected to the base of T2 and the collector of T2 connected to the base of T1; similarly transistor T3 and T4 represent the switch component of SECTION B and transistors T5 and T6 represent the switch component of SECTION C. The effect of the regenerative interconnection is that both transistors T1 and T2, for example are conducting or both are non-conducting. T1 and T2 can be rendered conducting by a positive signal on the gate G provided that the terminal MT2 is positive with respect to MT1, but they cannot be switched off by a signal on the gate G, although they become non-conducting if MT2 becomes negative with respect to MT1.

Clearly, a four-layer switch component such as SECTION A cannot by itself conduct alternating current from MT1 and MT2, and to achieve this a triac construction is used which employs two four-layer switch components back-to-back, like SECTION A and SECTION C, the latter being of opposite conductivity type to SECTION A. The interconnection indicated by the line from the base of the transistor T2 to the base of the transistor T5 is provided by the conductivity of the first layer 1, which layer constitutes an electrode of both components. Coupling between SECTION A and SECTION B and between SECTION B and SECTION C is provided through the N-layer 1 to achieve the necessary gating voltage. Typically a gate drive current of about 1 mA is appro undesired latch condition and can be avoided by limiting the size of the P regions 3 and 4 and reduction of carrier lifetime in the lateral path through the layer 1. Various arrangements in triacs have been proposed for causing the components of SECTION A and SECTION C to conduct as the polarity of an alternating current passing between MT1 and MT2 changes but these lie outside this invention and will not be discussed.

The device shown in FIG. 1 differs from a triac in the provision of a third four-layer switch component, SECTION B, which is coupled to SECTION A and SECTION C by the conductivity of the first and second layers 1 and 2. Note that one end electrode of SECTION B is not connected to terminal MT1 as are the corresponding electrodes of SECTION A and SECTION B, but is taken to the secondary gate terminal SG.

In order to achieve full a.c. cycle conduction (when switched on) of the device shown in FIG. 1 it is necessary to provide a potential negative with respect to the terminal MT1, to which potential the secondary gate SG is connected. During a half-cycle of the a.c. being controlled in which MT2 is positive with respect to MT1, the SECTION A component would convey the current as with a conventional thyristor. Conduction of SECTION A once established, will be maintained throughout the half-cycle even if the gate current or voltage which initiated conduction were to be removed because of the regeneration. As the voltage on MT2 falls to that of the MT1 the SECTION A component ceases conducting, but SECTION B remains conducting until MT2 falls to the more negative potential at the secondary gate SG. When MT2 is negative with respect to MT1 the SECTION C component becomes conducting, the gating voltage for this component being derived from the still-conducting SECTION B, although SECTION A is not conducting at this time. Once conduction is established the SECTION C component remains conducting for the whole of the half-cycle in which MT2 is negative with respect to MT1, and again because of the regeneration the conduction of the SECTION C component is not affected by removal of the gating signal. As the voltage on MT2 approaches that on MT1 again SECTION C commutates, SECTION A would then take over conduction of the next half-cycle provided that the main gate is positive with respect to MT1 and the whole switching cycle is repeated.

To prevent conduction of the device during both half-cycles of the alternating voltage the potentials in the gate G must be maintained close to (within 0.6 volts) the potential on the secondary gate SG or below that of MT1 if regions 3 and 4 are isolated.

The device of FIG. 1 could be made in a number of ways. For example, a homogeneous silicon slice having the first, n-type, layer 1 and the second, p-type, layer 2 could be produced by diffusion of p-type impurity into an n-type substrate or of n-type impurity into a p-type substrate, or by epitaxial deposition of the appropriate conductivity type semiconductor on to a substrate. A way of producing the regions 3, 4, 5, 6, 7 and 8 would be to use conventional masking and diffusion techniques. Finally, metallization would be applied to both faces followed by masking and etching as required to produce the required interconnections and contact areas.

Figure 9:
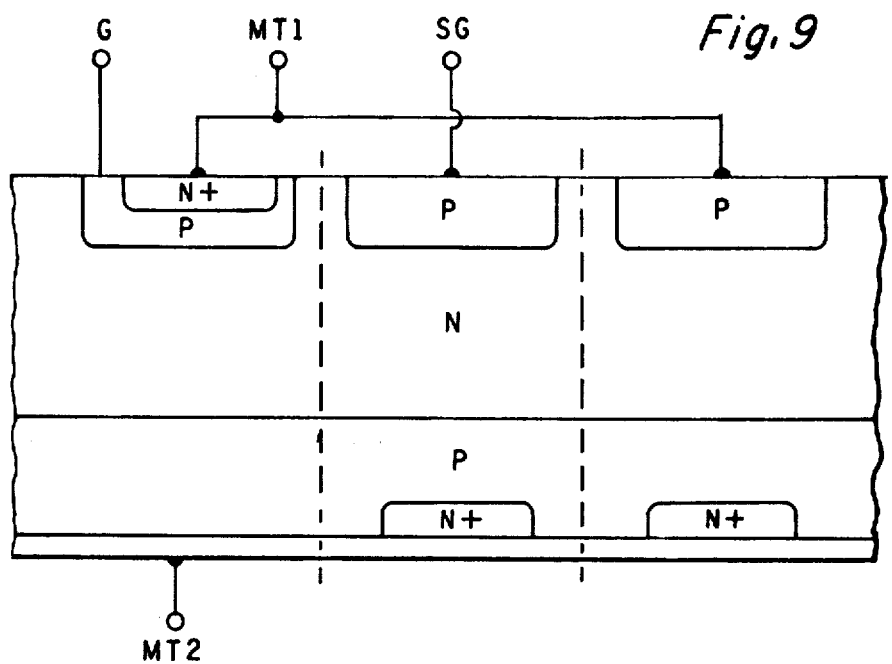
FIGS. 9 and 10 illustrate modifications of the embodiment of FIG. 1.
Figure 10:
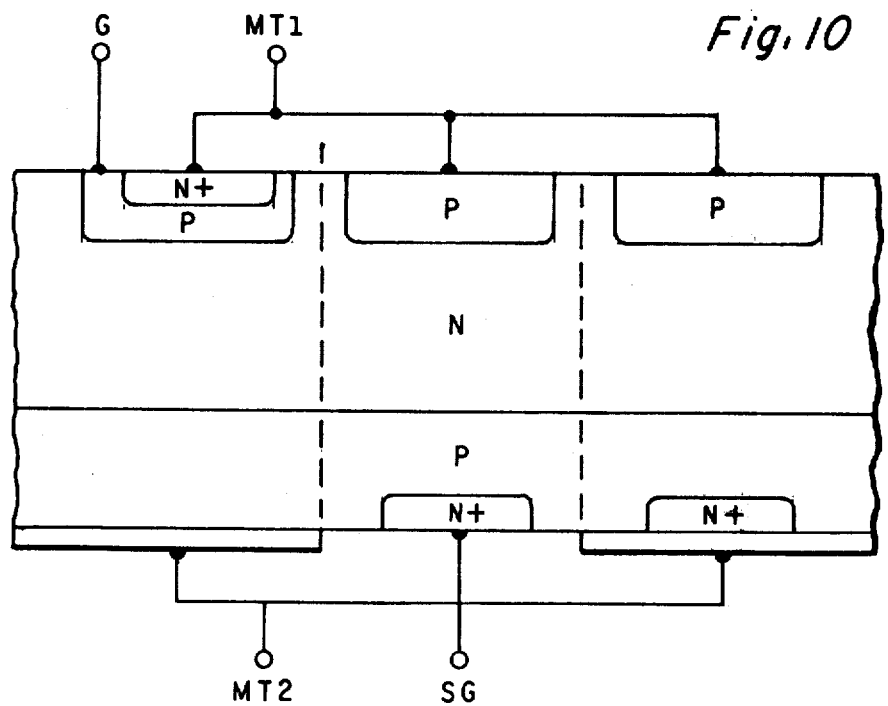
Figure 11:
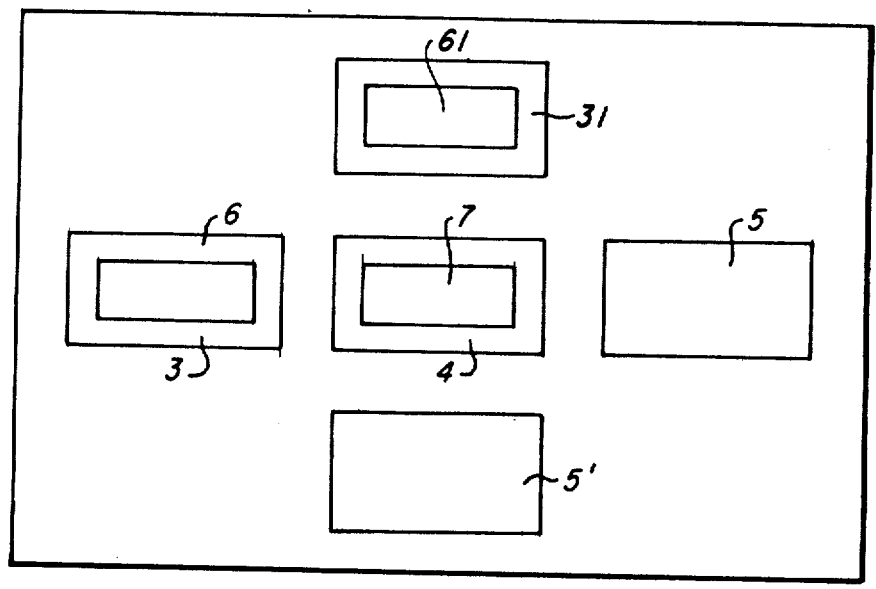
FIGS. 11 and 12 depict the semiconductor structure and a transistor equivalent circuit of a further embodiment of the invention.
Figure 12:
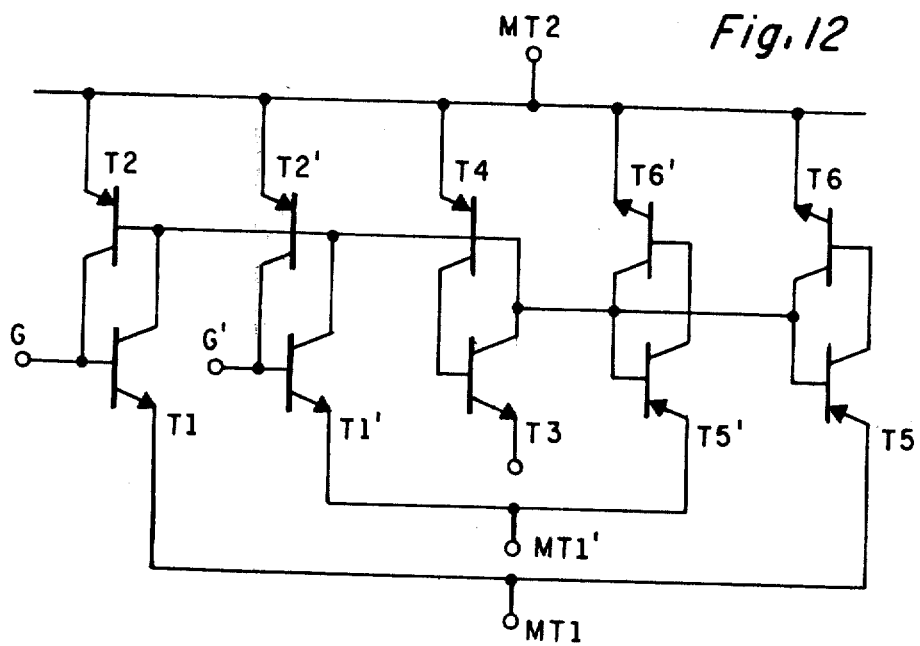

Although the device has been described with reference to a specific embodiment, it will be understood that many modifications could be made to the embodiment without parting from the invention. For example, the conductivity types throughout could be reversed from those shown. Although the SECTION B component is shown in FIG. 1 to be located between the SECTION A component and the SECTION C component it is not necessary for it to be so located, provided that there is adequate electrical coupling between SECTION A and SECTION B and between SECTION B and SECTION C within the first layer to provide the necessary gating voltage which needs to be typically greater than 0.8 V at the working junction as with most other thyristor structures. In addition, although SECTION B is shown as being similar to SECTION A, it could be produced in a form similar to SECTION C in which case the secondary gate terminal SG would be connected to either a region like the region 5 (FIG. 9) or to a region like the region 8 (FIG. 10), but in SECTION B. With such a device, the other end connection of SECTION B would be connected to MT1 or MT2 and the secondary gate voltage would be positive with respect to MT1 if the terminal SG is connected to a p-type region like the region 5, or negative with respect to MT2 if the terminal SG is connected to an n+-type region like the region 8.

In FIG. 1 the SECTION B component is shown in association with a single SECTION A component and a single section C component; such a one-to-one relationship is not necessary and one SECTION B could be associated with plurality of pairs of SECTION A and SECTION C components which may moreover have separate terminals MT1 (although the connection of a SECTION A to a SECTION C in each pair would still be provided). One exampa connection to the otherwise unconnected base of transistor T3 and collector of transistor T4 for use as an additional gate. Further, by making an appropriate one or ones of the pn junctions of transistors (e.g. of T1 or T3) optically sensitive, light triggering of the structure may be obtained.

Figure 2:
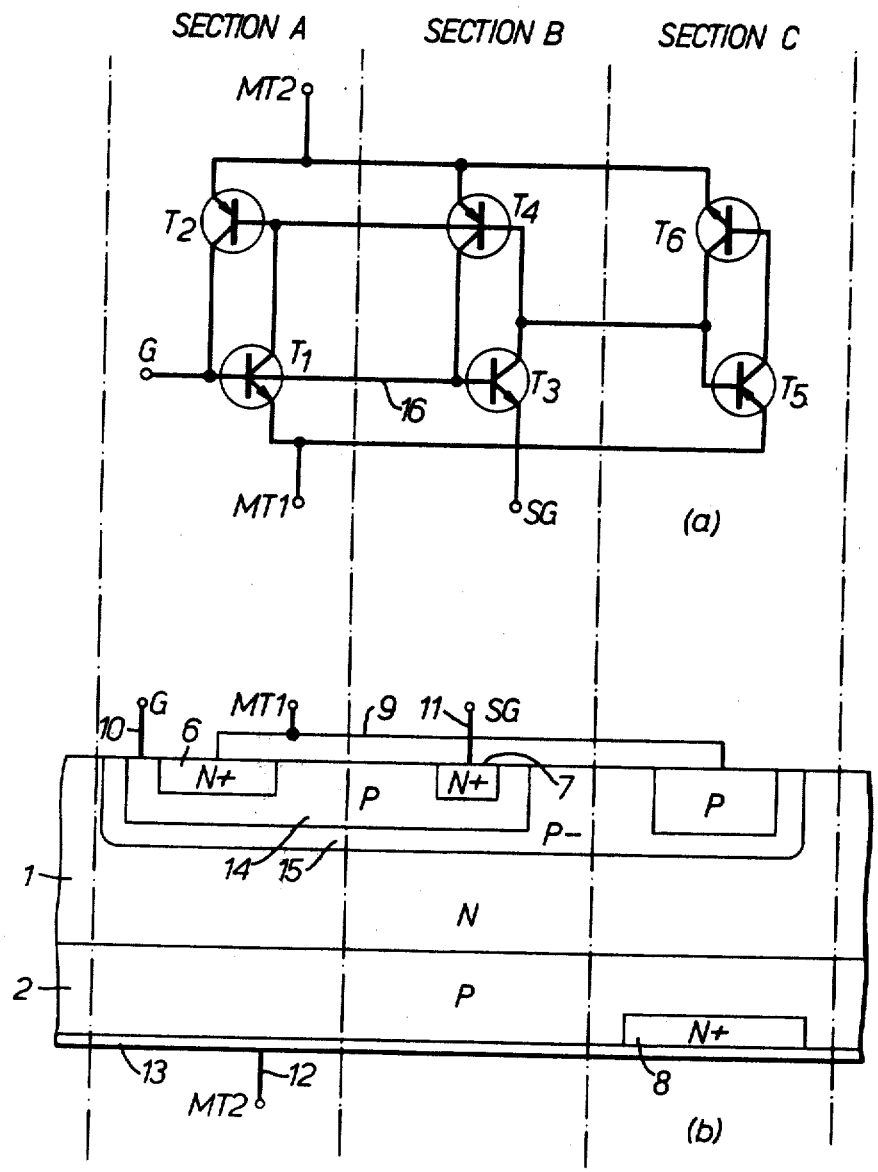
FIG. 2 shows a second embodiment of the invention, the transistor equivalent being shown at (a) and the semiconductor structure at (b)

FIG. 2 showns in the same manner as FIG. 1 a second embodiment of a device according to the invention which incorporates two further modifications, which could be incorporated singly in the embodiment shown in FIG. 1. Apart from these modifications FIG. 2 is the same as FIG. 1 and uses the same references. One modification is the combination of the p-type regions 3 and 4 of FIG. 1 into a single region 14 in FIG. 2. This has the effect of coupling the SECTION A and SECTION B components together even more closely by introducing a further connection 16 between the bases of transistors T1 and T3 as shown in (a) of FIG. 2. This modification makes the device more responsive to gating voltages applied to the terminal 9. The second modification is the provision of an additional, p-type conductivity, region 15 of low impurity concentration between the regions 5 and 14 and the remainder of the first layer 1, for the purpose of increasing the reverse breakdown voltage of the pn junctions between the regions 5 and 14 and first layer 1. This additional region 15 may be produced by diffusion and has the effect of increasing the operating voltage of the device.

The modifications described above with reference to FIG. 1 could in general be applied to the embodiment of FIG. 2 or to a device incorporating only one of the modifications shown in FIG. 2, although there are certain exceptions which will be immediately apparent to those skilled in the art.

Figure 3A:
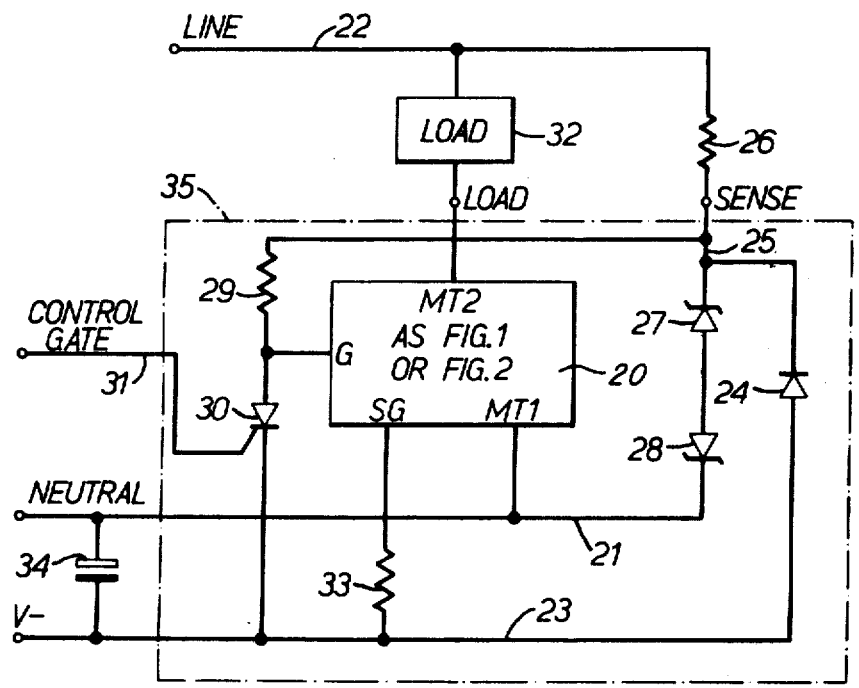
FIGS. 3A and 3B show functionally similar circuits of one example of an integrated circuit incorporating a device as shown in FIG. 1 or FIG. 2.

A device as shown in FIGS. 1 or 2 or modified as described could be embodied in a monolithic integrated circuit with certain other elements to reduce to a minimum the number of external components needed to achieve zero voltage switching for a.c. power control for a wide variety of circumstances. The circuit of one such integrated circuit is shown in FIG. 3A in which the block 20 is a device as shown in FIGS. 1 or 2 or modified as described. Conductors 21 and 22 are connected to neutral and line respectively of an a.c. supply main, and a third conductor 23 is provided on which a negative voltage required for the secondary gate SG is established by rectification of the mains by a rectifier 24, an alternating voltage from the mains being fed to circuit point 25 by resistor 26. The magnitude of the voltage at the point 25 is determined by series connected zener diodes 27 and 28. A bias voltage for the gate G is fed from the point 25 by a resistor 29, the gate G being connected to the conductor 23 through a thyristor 30, the gate of which is connected to a control gate terminal via a conductor 31. A load 32 in which the a.c. power is to be controlled is connected between the terminal MT2 and the conductor 22. The supply for the secondary gate SG is fed through a resistor 33 from the conductor 23. A capacitor 34 is connected between conductors 21 and 23 as a reservoir for the d.c. voltage. The conductor 21 is connected to the terminal MT1 of the device 20. It is envisaged that all of the circuitry within the chain dotted rectangle 35 would be formed on a monolithic integrated circuit having five terminals: LOADS, SENSE, CONTROL GATE, NEUTRAL and −V as shown.

The resistor 26 and the capacitor 34 are not included in the integrated circuit because they would occupy too much wafer area and are more economically produced as discrete components. Typically the resistor 26 is 22 kΩ, 5 watt and the capacitor 34 is 47 μF.

The device 20 requires a positive voltage to become conducting when MT2 is positive with respect to MR1. In order to ensure that it becomes conducting at a zero crossing and at no other time the thyristor 30 is provided connecting the gate G to the secondary gate supply −V, and an alternating voltage from the supply is applied to the gate G by the resistor 29. A positive voltage can only be applied to the gate G if the thyristor 30 is non-conducting as the alternating voltage at the point 25 goes positive relative to the neutral conductor 21, because a thyristor cannot be turned off by its gate.

The circuit of FIG. 3A responds to a negative voltage applied to the CONTROL GATE terminal by turning on the mains supply current to the load 32 and that current is maintained until a positive voltage sufficient to cause the thyristor 30 to conduct is applied to the control gate terminal, the switching taking place at the next following zero crossing time of the mains supply in the positive-going direction.

Figure 3B:
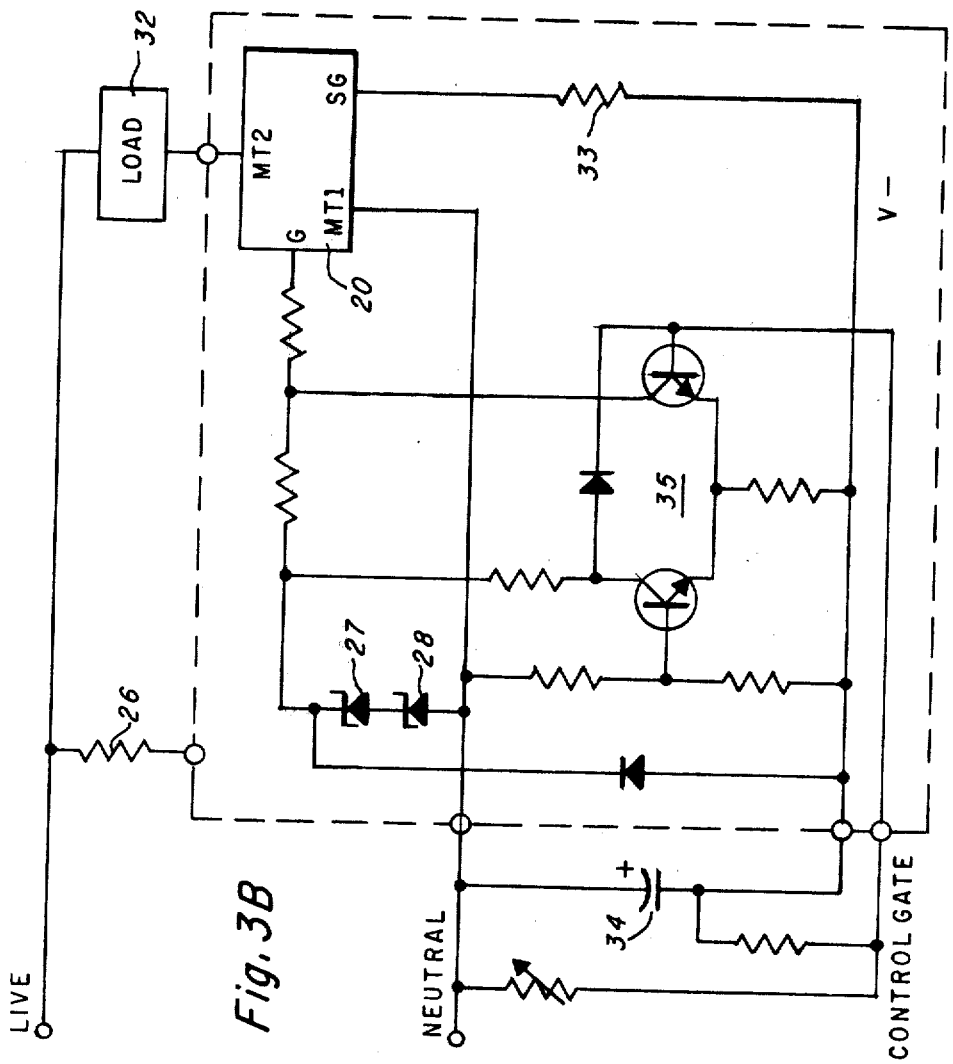

FIG. 3B shows a modification of FIG. 3A wherein the thyristor 30 is replaced by a bipolar transistor bistable switch 35, circuit operation being unchanged.

Figure 4A:
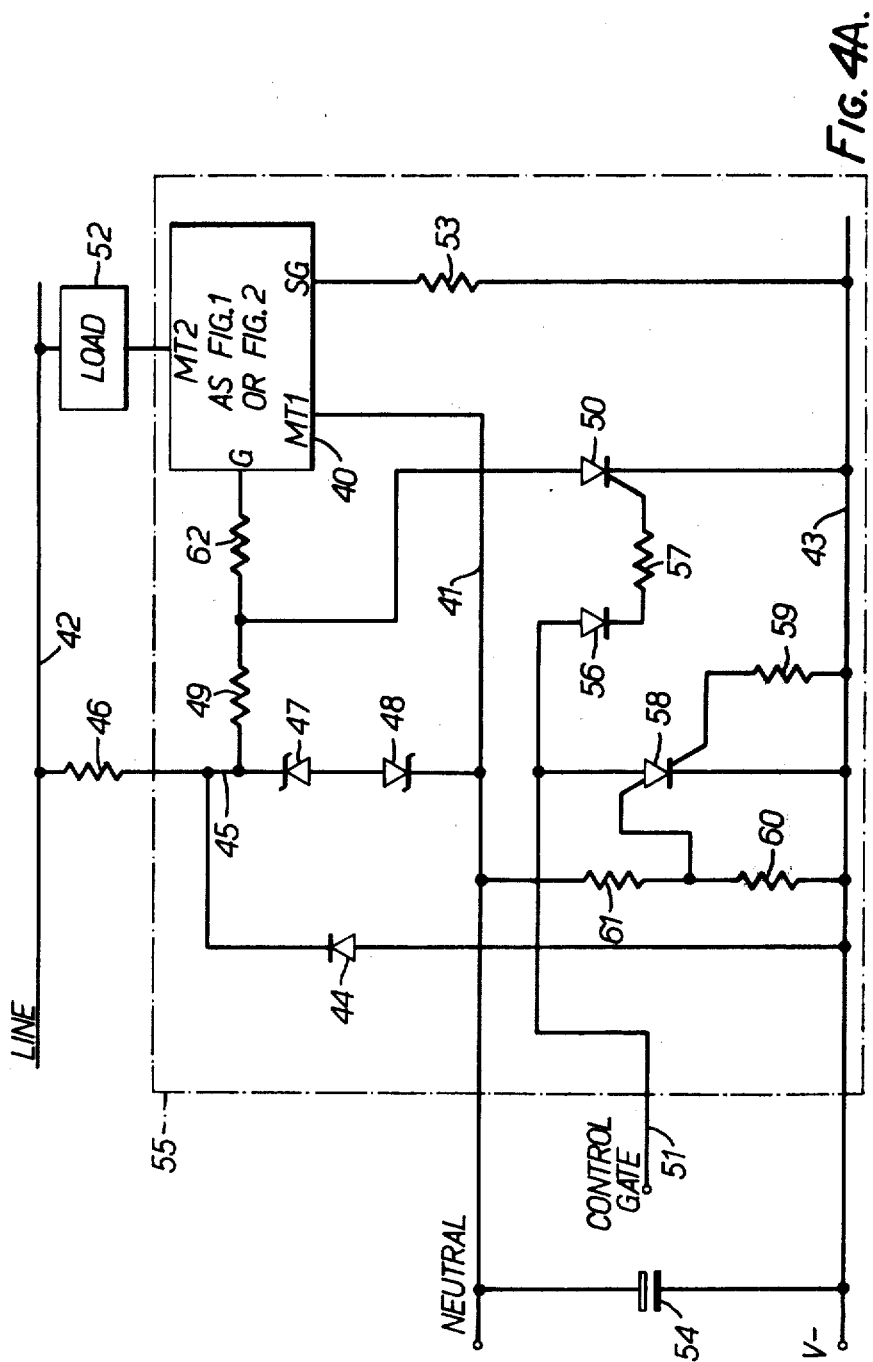
FIGS. 4A and 4B show functionally similar circuits of a second example of an integrated circuit incorporating a device as shown in FIG. 1 or FIG. 2.

FIG. 4A shows the circuit of another example of a monolithic integrated circuit embodying a device according to the invention, which includes some additional circuit elements over the FIG. 3A circuit, the function of which elements is to enable the circuit to provide proportional control of the current through the load instead of simply switching the current off and on depending on whether the voltage applied to the CONTROL GATE terminal is above or below a threshold value as the FIG. 3A circuit does. The proportional control, which takes the form of cyclic switching off and on of the load current with a mark-to-space ratio which depends on the voltage at the CONTROL GATE terminal, is effective over only a central range of CONTROL GATE voltages, above which the load current is off and below which the load current is on. The circuit of FIG. 4A requires an external capacitor and some other external components which depend on the particular application to which the circuit is put, and therefore the description of the operation of the circuit of FIG. 4A will be given later in conjunction with FIG. 7 which illustrates a typical application.

With regard to FIG. 4A itself many of the circuit elements correspond to those of FIG. 3A and have reference numerals increased by 20. The chief differences between the circuits of FIG. 4A and FIG. 3A lie in the connection to the gate of the thyristor 50, the connection in FIG. 3A being direct to the CONTROL GATE terminal. In FIG. 4A the conductor 51 from the CONTROL GATE terminal is connected to the gate electrode of the thyristor 50 through a diode 56 and a resistor 57. The conductor 51 is also connected to the secondary gate supply conductor 43 through a thyristor 58 having both internal electrodes brought out to gate connections, of which one gate is connected to the conductor 43 via a resistor 59 and the second gate is connected to the tapping of a voltage divider formed by resistors connected from the NEUTRAL conductor 41 to the conductor 43. The only other change in FIG. 4A is the provision of a resistor 62 connecting the thyristor 50 to the gate terminal of the device 40.

Figure 4B:
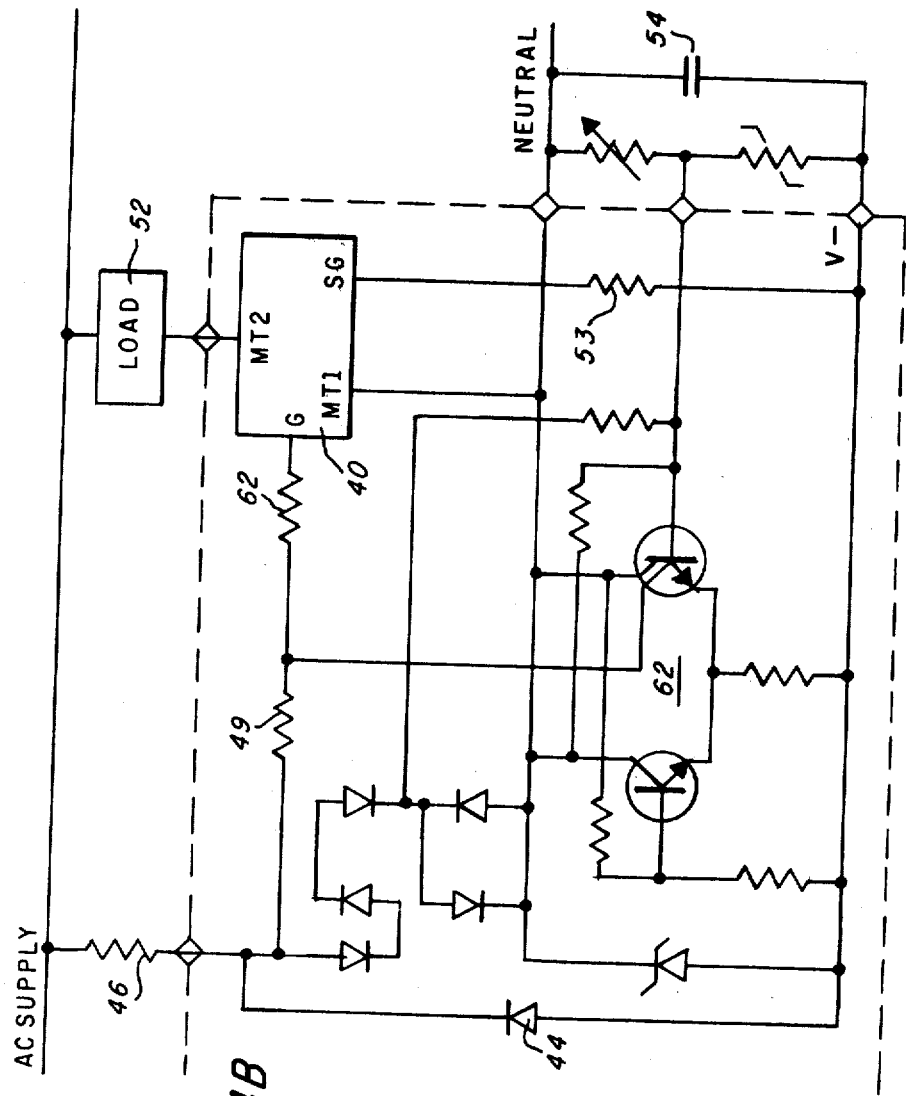

FIG. 4B shows a modification of FIG. 4A wherein the switching circuits comprising thyristors 50 and 58 are replaced by a bipolar bistable switch 63. Otherwise, circuit operation remains unchanged.

Figure 5:
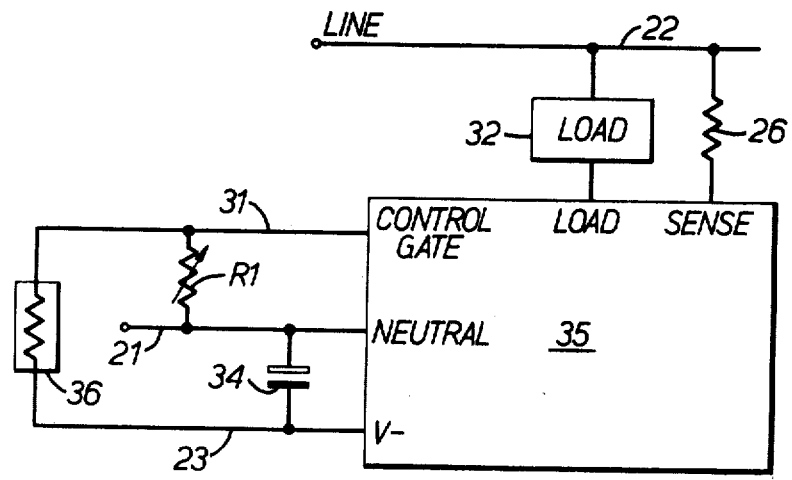
FIGS. 5, 6 and 8 illustrate applications of the integrated circuit of FIG. 3.

FIG. 5 shows one application of the integrated circuit 35 of FIGS. 3A or 3B in which the CONTROL GATE terminal is connected to the tapping of a voltage divider formed by a variable resistor R1 connected in series with a temperature sensitive resistor 36, such as a Texas Instruments TSM 102, from the NEUTRAL terminal to the V-terminal. A mains a.c. supply would be connected to the neutral and live conductors 21 and 22. The load 32 in this instance might be, for example, an electrical heating element. In the operation of the circuit of FIG. 5 as the temperature of the resistor 36 rises, e.g. under the influence of the heating element, its resistance increases so that the voltage at the CONTROL GATE terminal becomes more positive until the current through the load 32 is cut off. The resistor 36 now becomes cooler and consequently the voltage at the CONTROL GATE terminal becomes more negative until the load current is switched on again. As described above the switching on and off of the load current takes place at positive-going zero crossings of the a.c. supply.

Figure 6:
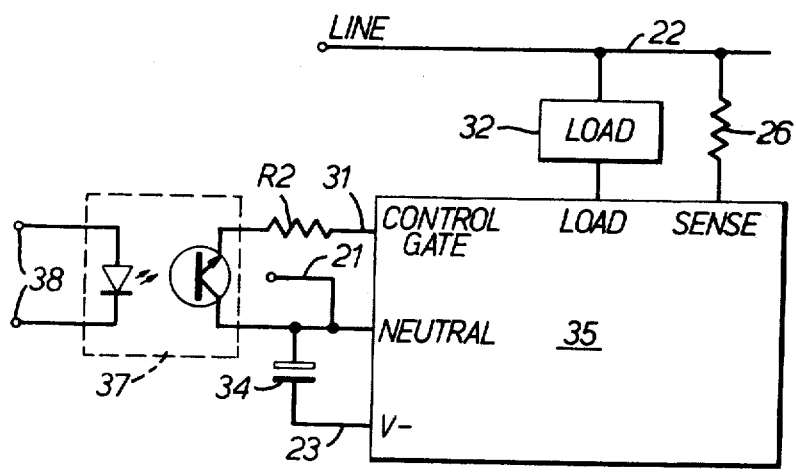

FIG. 6 shows another application of the FIG. 3A or 3B circuit in which the CONTROL GATE terminal is connected to the NEUTRAL terminal through a resistor R2 in series with the photo-transistor of an opto-coupler 37, such as a Texas Instruments TIL 111. An electrical signal applied to terminals 38 causes the light emitting diode of the opto-coupler to emit light which results in the voltage at the CONTROL GATE terminal becoming more positive than the V-terminal so that the supply to the load 32 is cut off. This circuit provides complete isolation of the switching signal from the mains supply.

Figure 8:
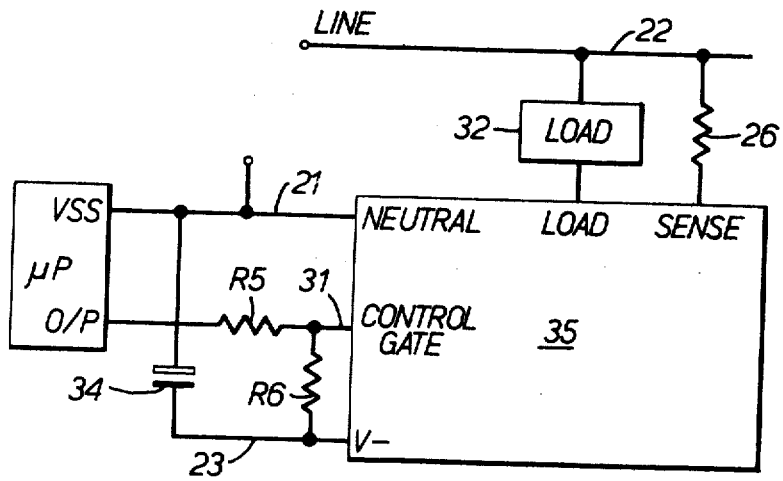

FIG. 8 shows the connection of the FIG. 3A or 3B circuit to respond to a logic signal from an output O/P of a microprocessor $\mu P$, which may for example be a Texas Instruments TMS 1000. Resistors R5 and R6 are chosen to adjust the logic signal voltage levels to suit the gate of the thyristor 30 in the circuit 35.

As mentioned above, FIG. 7 shows an application of the proportional control circuit of FIG. 4A. A timing capacitor C is connected in parallel with a variable resistor R4 between the CONTROL GATE terminal and the V-terminal of the circuit 55. A sensing resistor RS, e.g. a temperature sensitive resistor is connected in series with a resistor R3 from the CONTROL GATE terminal to the NEUTRAL terminal of the circuit 55. If the timing capacitor C were omitted the voltage at the CONTROL GATE terminal would be determined by the voltage divider chain formed by the resistors R3 and R4 and the sensing resistor RS and adjustable by adjustment of R4. Suppose that the load 52 were a heater and the sensing resistor RS were a positive temperature coefficient resistor thermally coupled to the heater. With the heater and resistor RS cold the resistor RS has a relatively low value so that the voltage at the CONTROL GATE terminal is relatively more positive. If that voltage is more positive than the voltage tapping of the voltage divider formed by resistors 60 and 61 the thyristor 58 becomes conducting and will remain conducting provided that the current passed by the resistors R3 and RS is above a holding value for thyristor 58 which is partly defined by resistor 59. When the thyristor 58 is conducting the voltage on the conductor 51, reduced by the forward conduction voltage of the diode 56 is insufficient at the gate of the thyristor 50 to cause it to conduct. Therefore a relatively positive voltage at the CONTROL GATE terminal results in the thyristor 50 being nonconducting and therefore current being applied continuously to the load 52. On the other hand, if the CONTROL GATE voltage is relatively negative, e.g. due to the resistor RS being hot and of high resistance, but more than 0.7 volts positive with respect to the V-conductor 43, the thyristor 58 is not conducting because the CONTROL GATE voltage is more negative than the voltage set up by the voltage divider 60, 61 and the CONTROL GATE voltage is applied with only the reduction due to the forward conduction voltage of the diode 56 to the gate of the thyristor 50 which is thereby switched to a conducting state, so that no current is fed to the load 52. As so far described the control of the load current is such that it is on or off depending on the CONTROL GATE voltage in a similar manner to FIG. 5, but in the opposite sense.

The proportional control mode occurs when the resistor RS is at an intermediate temperature and has a resistance between the two extremes described above and requires the timing capacitor C to determine the "on" and "off" periods of the load current. Under these conditions the CONTROL GATE voltage is more positive than the voltage provided by the voltage divider 60,61 so that the thyristor 58 is switched on, but the current through the resistors R3 and Rs is insufficient to meet the current demand of the thyristor 58 with the result that the timing capacitor C is steadily discharged as it provides the additional current required by the thyristor 58. After a time interval depending on the capacitance of the capacitor C and the size of the current shortfall, the CONTROL GATE voltage falls below that needed by the thyristor 58 to maintain conduction so that the thyristor 58 ceases conducting provided that the current through Rs and R3 is less than the holding value which is partly determined by R 59. Relieved of the current drain due to the conducting thyristor 58 the capacitor C is recharged by the current through R3 and RS until the CONTROL GATE voltage again exceeds the voltage at the junction of resistors 60 and 61 when the thyristor 58 becomes conducting again and the cycle recommences. As described above, when the thyristor 58 is conducting the thyristor 50 is non-conducting and current is applied to the load 52, and when the thyristor 58 is non-conducting and the thyristor 50 is conducting no current is applied to the load.

Figure 7:
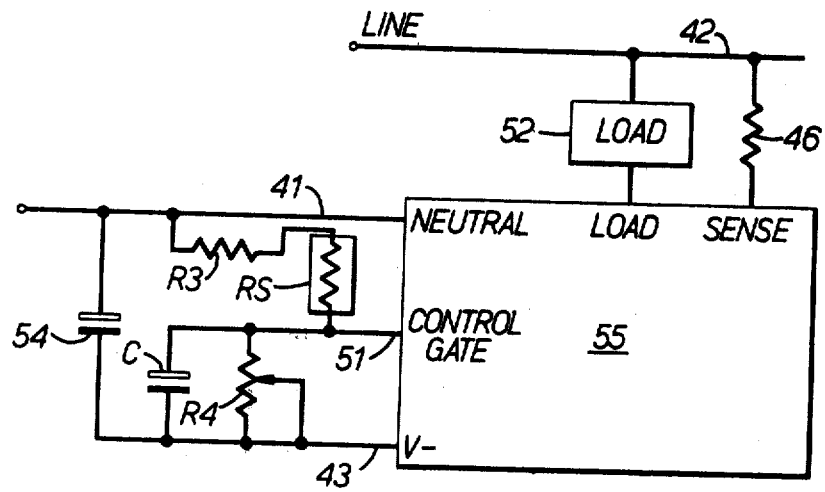
FIG. 7 illustrates an application of the integrated circuit of FIG. 4.

The circuit of FIG. 7 therefore has three states depending on the resistance of the sensing resistor RS. In a first state current is applied continuously to the load 52, in a second current is applied to the load 52 intermittently, and in a third no current is applied to the load 52. Of course, the switching on and off of the load current takes place at positive-going zero crossing instants of the alternating voltage supply.

It will be apparent that the circuit of FIG. 7 could provide thermostatic control of an electric heater connected as the load 52 if the sensing resistor RS were a positive temperature coefficient resistor. When FIG. 7 is put to such a use the variable resistor R4 would provide adjustment of the temperature to which the resistor Rs is thermostatically controlled.

The invention is of particular value in the thermostatic control of heaters or heating elements when the circuit of FIG. 5 or FIG. 7 could be used. The invention could also be used for electric motor starting and speed control using either straight forward on-off switching or phase switching to provide power control; phase switching would be achieved by using a device according to the invention in conjunction with a reactance.

Although particularly suited to zero-voltage switching control, the improved switch device described herein, particularly with reference to FIGS. 1 and 2, also is amenable to control at other points in the a.c. supply voltage cycle.

What is claimed is:

1. A semiconductor switch device including a thyristor structure having first, second and third four-layer semiconductor switch components formed in the same semiconductor body; said semiconductor body comprising a first continuous layer of a first conductivity type in overlying relationship with a second continuous layer of a second conductivity type opposite from that of said first conductivity type, said first and second layers providing opposite major surfaces of said semiconductor body; said first switch component having a first region of the second conductivity type in said first layer and forming a first gate of the switch device, and a second region of the first conductivity type in said first region; said second switch component having a third region of the conductivity type in said first layer and a fourth region disposed in the second layer opposite the third region and having the first conductivity type; said third semiconductor switch component having a fifth region of the second conductivity type in said first layer and a sixth region of the first conductivity type in at least one of said first and second layers, said third switch component electrically coupled through the semiconductor body to the first and second switch components; each of said switch components having one end electrode at said first major surface and another end electrode at said opposite major surface; connection means for joining the second and third regions to form a first main terminal of the switch device; conductive means connecting surface areas of the second layer opposite the first and fifth regions to said fourth region, said conductive means forming a second main terminal of the switch device and an end terminal contact to one of said fifth and sixth regions providing a second gate for the switch device.

2. A semiconductor switch device according to claim 1, wherein said sixth region is located in said fifth region and provides said second gate.

3. A semiconductor switch device according to claim 1, wherein said sixth region is located in said second layer opposite said fifth region; said fifth region defining said second gate and said conductive means additionally being connected to said sixth region.

4. A semiconductor switch device according to claim 1, wherein said sixth region is located in said second layer opposite the fifth region and provides said second gate; and wherein said fifth region is connected to said second and third regions.

5. A semiconductor switch device according to claim 2 or claim 4, wherein said first and fifth regions are defined by a single region in said first layer.

6. A semiconductor switch device according to claim 2 or claim 3 or claim 4, in which said first, third and fifth regions are formed in a further region of said second conductivity type in said first layer, said further region having lower impurity concentration then said first, third and fifth regions.

7. A semiconductor switch device comprising three four-layer semiconductor switch components laterally positioned with respect to each other and each extending from one major face to an opposite major face in the same body of semiconductor material; said body including a first layer of a first conductivity type extending to said one major face; a second layer of a second conductivity type, opposite from that of the first conductivity type, extending from the first layer to said opposite major face providing a continuous junction shared by all of said switch components; first, second and third regions of the second conductivity type formed in said first layer at said one major face; first and second regions of the first conductivity type respectively formed in said first and second regions of the second conductivity type and extending to said one major face; and a third region of the first conductivity type formed in said second layer at said opposite major face opposite said third region of the second conductivity type; said first regions and adjacent parts of said first and second layers in superposed relation forming a first of said semiconductor switch components; said second regions and adjacent parts of the first and second layers in superposed relation forming a second of said semiconductor switch components; and the third regions and the parts of the first and second layers between them in superposed relation forming the third of said semiconductor switch components; said second regions located sufficiently close to the first and third regions to provide sufficient d.c. coupling between said first and second switch components and between said second and third switch components for one of said switch components to be able to switch the other; a first main terminal formed by an ohmic connection from the first region of the first conductivity type to the third region of the second conductivity type; a second main terminal formed by an ohmic connection from the third region of the first conductivity type to areas of said opposite face of said body opposite the first and second regions; first gate connection means to said first region of the second conductivity type; and second gate connection means to said second region of the first conductivity type.

8. A semiconductor switch device according to claim 7, wherein the first and second regions of the second conductivity type are defined by a single region.

9. A semiconductor switch device according to claim 7 or claim 8, including at least one further region of the second conductivity type, but of lower impurity concentration, in the first layer, in which further region said first, second and third regions of the second conductivity type are formed.

10. A semiconductor switch device according to claim 7, including a plurality of pairs of said first and second semiconductor switch components formed in said body of semiconductor material, each said pair defining a triac structure; said third four-layer switch component so disposed in said body as to be electrically coupled to the first and second switch components of each said triac structure.

11. A semiconductor switch device according to claim 1 or claim 7, including as an integrated part of said semiconductor body, means for deriving from an a.c. supply a direct gating voltage for application to said second gate connection of the device.

12. A semiconductor switch device according to claim 11, including as integrated parts of said semiconductor body, means for applying to said first gate connection body, means for applying to said first gate connection of the device an alternating voltage in phase with said a.c. supply; a semiconductor control switch formed therein and connected from said first gate connection to a conductor on which said direct voltage is established and a control gate connection for the circuit connected to a control electrode of said semiconductor control switch.

13. A semiconductor switch device according to claim 12, wherein the semiconductor control switch is a first thyristor and wherein the semiconductor body incorporates a second thyristor formed therein and connecting the gate connection of said first thyristor to said conductor on which the direct voltage is established; said second thyristor arranged to draw a predetermined current from said gate connection when the voltage on the gate connection differs by more than a predetermined amount from the voltage on said conductor on which the direct voltage is established.

14. A semiconductor switch device according to claim 12, wherein said semiconductor control switch is a bipolar semiconductor bistable circuit.

15. A circuit arrangement including an integrated semiconductor circuit switch device according to claim 11, capacitor means connected to the integrated circuit for storing said direct voltage; load means connected in series with said integrated circuit from one a.c. supply conductor to another; and means connected to the integrated circuit for providing a signal to control the a.c. power applied to the load.

16. A semiconductor multiple switch device including a structure having a plurality of pairs of first and second four-layer semiconductor switch components and a common third four-layer semiconductor switch component all formed in the same semiconductor body; said semiconductor body comprising a first layer of a frist conductivity type in overlying relationship with a second layer of a second conductivity type opposite from that of said first layer; each said first switch component having a first region of the second conductivity type in said first layer and a second region of the first conductivity type in said first region; each said second switch component having a third region of the second conductivity type in said first layer and a fourth region disposed in the second layer opposite the third region and having the first conductivity type; said third semiconductor switch component having a fifth region of the second conductivity type in said first layer and a sixth region of the first conductivity type in at least one of said first and second layers, said third switch component electrically coupled through the semiconductor body to the first and second switch components of each said pair; each said switch device comprising a triac structure defined by one of said pairs of first and second switch components and the common third switch component; connection means for joining the second and third regions of a said pair of first and second switch components to form a first main terminal for the switch device including said pair; conductive means connecting surface areas of the second layer opposite each of the first regions and the fifth region to the said fourth regions, said conductive means forming a second main terminal of said switch devices; and one of said fifth and sixth regions providing a second gate for all of said switch devices.

17. A semiconductor switch device including a plurality of pairs of first and second four-layer semiconductor switch components formed in the same body of semiconductor material and each component having two end terminal regions; a first gate connection to one of the first and second switch components of each said pair; and a third four-layer semiconductor switch component formed in said semiconductor body having two end terminal regions and providing electrical coupling through the semiconductor body between the first and second switch components of each said pair; said third switch component having an end terminal region electrically separate from corresponding end terminal regions of the first and second switch components to provide a common second gate connection for the switch device; means connecting together said corresponding end terminal regions of the first and second switch components of the respective said pairs; and means connecting together the other end terminal regions of the first, second and third switch components.

18. A control circuit comprising:
1. first and second a.c. supply lines for connection to an a.c. power source;
2. an integrated circuit including:
   a gate controlled semiconductor switch device including first, second and third four-layer semiconductor switch components formed in a common body of semiconductor material having opposite major surfaces between which each of said components extends with all of said switch components sharing a continuous pn junction, and each of said switch components having one end electrode region at one of the major surfaces and another end electrode at the other one of the major surfaces; a first gate connection to one of said first and second switch components; said third switch component electrically coupled through said semiconductor body to the first and second switch components; each of said switch components having first and second end electrodes; means connecting together said first end electrodes to define a first main terminal for said switch device at one of said major surfaces; means connecting together the second end electrodes of the first and second switch components to define a second main terminal for said switch device at the other major surface; the second end electrode of the third switch component defining a second gate connection for the switch device;

3. circuit means connected between one of said first and second a.c. supply lines and said second gate connection for deriving from said a.c. power source a d.c. gating voltage for application to said second gate terminal;

4. load impedance means connecting said first main terminal to one of said a.c. supply lines and means connecting the second main terminal to the other a.c. supply line; and 5. activation means for applying to said first gate connection a gating voltage for controlling the conductivity of said controlled semiconductor switch device.

19. A control circuit according to claim 18, including capacitor means connected to said integrated circuit for storing said d.c. gating voltage.

20. A control circuit according to claim 18, wherein said activation means includes condition sensing means responsive to a control parameter for controlling application of said gating voltage to the semiconductor switch device.

21. A control circuit according to claim 18, including means for applying to said first gate connection an alternating voltage in phase with said a.c. power source; said semiconductor body further incorporating a semiconductor control switch formed therein and connected from said first gate connection to a conductor on which said d.c. gating voltage is established; and a control gate connection for the circuit connected to a control electrode of said semiconductor control switch.

22. A control circuit according to claim 21, wherein the semiconductor control switch is a first thyristor and wherein the semiconductor body incorporates a second thyristor formed therein which connects the gate connection of said first thyristor to said conductor on which the d.c. gating voltage is established; said second thyristor arranged to draw a predetermined current from said gate connection when the voltage on the gate connection differs by more than a predetermined amount from the voltage on said conductor on which the d.c. gating voltage is established.

23. A gate controlled semiconductor switch device having a pair of power supply terminals and comprising at least three four-layer semiconductor switch components formed in a common body of semiconductor material having a pair of opposite major surfaces; each said switch components having four superposed semiconductor layers in said common body and extending between said opposite major surfaces; one layer of each said switch component disposed in one of said major surfaces and another layer of each said switch component disposed in the other said major surface; one of said switch components electrically coupled to the others of said at least three switch components through a semiconductor layer of said body; a power supply terminal connection common to all of said switch components at one of said major surfaces; a power supply terminal connection common to the others of said at least three switch components at the other major surface; and means for coupling a gate signal to at least one of said others of said at least three switch components at the other major surface.

* * * * *